United States Patent
Naik et al.

(10) Patent No.: US 7,572,734 B2
(45) Date of Patent: Aug. 11, 2009

(54) ETCH DEPTH CONTROL FOR DUAL DAMASCENE FABRICATION PROCESS

(75) Inventors: Mehul Naik, San Jose, CA (US); Suketu A. Parikh, San Jose, CA (US); Michael D. Armacost, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/877,964

(22) Filed: Oct. 24, 2007

(65) Prior Publication Data

US 2008/0102638 A1    May 1, 2008

Related U.S. Application Data

(60) Provisional application No. 60/863,324, filed on Oct. 27, 2006.

(51) Int. Cl.
*H01L 21/311* (2006.01)
(52) U.S. Cl. .................. 438/702; 438/714; 257/758; 257/E21.249
(58) Field of Classification Search .......... 438/702; 257/E21.249
See application file for complete search history.

(56) References Cited

U.S. PATENT DOCUMENTS

| | | | |
|---|---|---|---|
| 6,291,357 B1 | 9/2001 | Zhang et al. |
| 6,489,248 B2 | 12/2002 | Zhang et al. |
| 6,518,192 B2 | 2/2003 | Khan et al. |
| 6,939,811 B2 | 9/2005 | Kamp et al. |
| 7,279,114 B1 | 10/2007 | Hong |
| 2002/0142613 A1 | 10/2002 | Fu et al. |

*Primary Examiner*—Matthew Smith
*Assistant Examiner*—Walter H Swanson
(74) *Attorney, Agent, or Firm*—Patterson & Sheridan, LLP (57) ABSTRACT

The etch depth during trench over via etch of a dual damascene structure in a dielectric film stack is controlled to be the same over the dense area and the open area of a substrate and solve micro-loading problems. The trench etch process is adapted to include a forward micro-loading etching process and a reverse micro-loading etching process using two etch chemistries together with the inclusion of a dopant material layer or an organic fill material layer during the deposition of the dielectric film stack. In one embodiment, etching of trenches over vias is switched from forward micro-loading to reverse micro-loading once etching of the dielectric film stack is reached at a predetermined location of a dopant material layer. In another embodiment, etching of an organic trench filling material layer is performed in a reverse micro-loading process followed by etching the dielectric film stack in a forward micro-loading process.

20 Claims, 6 Drawing Sheets

ETCH DEPTH CONTROL FOR DUAL DAMASCENE FABRICATION PROCESS

CROSS-REFERENCE TO RELATED APPLICATIONS

This application claims the benefit of U.S. provisional patent application Ser. No. 60/863,324, filed Oct. 27, 2006, which is herein incorporated by reference.

BACKGROUND OF THE INVENTION

1. Field of the Invention

Embodiments of the invention generally relate to semiconductor processing technologies and, more specifically, to methods for fabricating a substrate containing dual damascene structures having low dielectric constant material thereon.

2. Description of the Related Art

Integrated circuits have evolved into complex devices that can include millions of components (e.g., transistors, capacitors and resistors) on a single chip. The demand for greater circuit density necessitates a reduction in the dimensions of the integrated circuit components, e.g., sub-micron dimensions and the use of various materials to fabricate devices in order to achieve much faster and better electrical performance, such as materials with higher conductivity used in metal lines, materials with lower permittivity (low-k) dielectric constant used as insulating materials, etc. For integrated circuit fabrication, metal interconnects with low resistance, such as copper and aluminum interconnects, provide conductive paths between the integrate circuit components on integrated circuit devices. Generally, metal interconnects are electrically isolated from each other by a dielectric bulk insulating material.

Some integrated circuit components include multilevel interconnect structures, for example, dual damascene structures. Typically, dual damascene structures have dielectric bulk insulating layers, semiconductive layers, low dielectric constant material layers, and conductive metal layers, such as conductive copper layers, stacked on top of one another. Vias and/or trenches are etched into the dielectric bulk insulating layer, and the conductive metal layers are subsequently filled into the vias and/or trenches and planarized, such as by a chemical mechanical planarization process (CMP), so that the conducting metal materials are left in the vias and/or trenches. In the dual damascene approach, a rather complex dielectric stack that includes a sequence of hard mask, low-k dielectrics, and etch stop layers, etc., may be required. In addition, via lithography and patterning as well as trench lithography and patterning are required for fabricating the complex dielectric stack before filling the vias and the trenches with the conductive metal materials.

Figure 1:
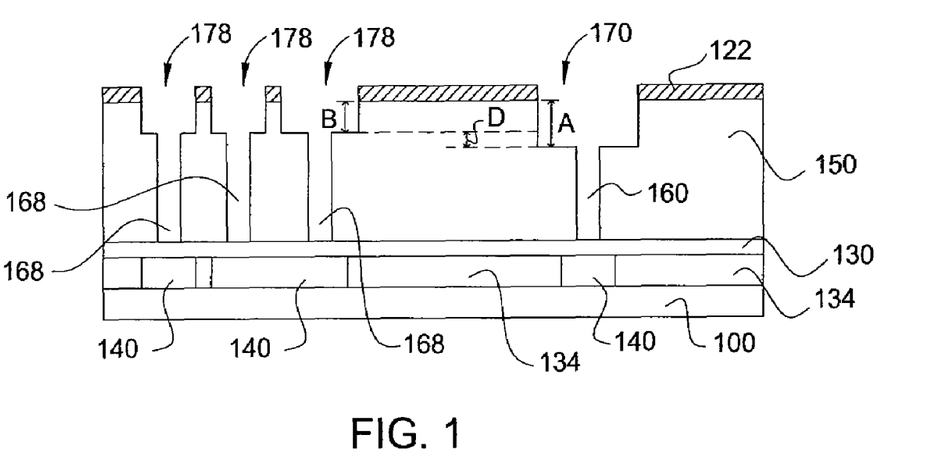
FIG. 1 is a sectional view of a dual damascene structure with micro-loading trench etch problem.

Different schemes to process a substrate containing dual damascene structures have been proposed. FIG. 1 is one example of a dual damascene structure having vias and trenches in a dielectric stack film stack 150 with micro-loading problems after trench etching. The dielectric stack film stack 150 is formed over a substrate 100 having a dielectric base layer 134 and a first layer of metal lines 140 formed thereon. The dielectric stack 150 may include a bottom barrier layer, one or more dielectric bulk insulating layers, and an optional middle etch stop layer. A top layer 122 may be deposited above the dielectric film stack 150 to protect the underlying dielectric film stack 150. The top layer 122 may be a capping layer, a hard mask layer, a dual hard mask layer, an etch stop layer, or a polish stop layer. The dielectric film stack 150 is generally made of a low dielectric constant (e.g., κ lower than 4) material for a copper dual damascene structure. The bottom barrier layer 130 can be silicon nitride, silicon carbide, silicon oxycarbide, or low k barrier materials. The top layer 122 typically includes silicon oxy-nitride (SiON), tetra-ethyl-ortho-silicate (TEOS) based oxide, silicon carbide, silicon dioxide, silicon nitride, silicon oxycarbide, and the like.

In a via first dual damascene fabrication scheme, via lithography and via etching and patterning are performed through the dielectric film stack 150 and stopped at the bottom barrier layer 130. A trench lithography process is then performed on top of the dielectric film stack 150 to transfer trench pattern from the top layer 122 to the dielectric film stack 150, perform trench etching therein, and define trench openings. Variations of the via first scheme may additionally include a bottom anti-reflective coating (BARC) layer to fill via openings and cover the dielectric film stack 150 before the trench lithography process. Additionally, a hard mask layer may be deposited over the BARC layer to serve as an etch mask layer in order to form trenches through lithography, patterning and BARC etching.

The dielectric film stack 150 may have a dense region with small critical dimension and high feature density (e.g., dense vias 168) and an open area with large critical dimension and low feature density (e.g., isolated vias 160). A major issue with a dual damascene fabrication process with no middle trench etch stop is that it is difficult to control the etch depth across features of different critical dimensions such that there is uneven trench etch depth between the dense area and open area. Many etching processes and chemistries manage to maintain a good etch profile without micro trenching; however, micro-loading problems invariably arise where the open area with large critical dimension are etched faster than the dense area with small critical dimension. For example, trench etching within the dielectric film stack 150 usually results in micro-loading such that trenches 170 in the open area with large critical dimension are etched faster than trenches 178 in the dense area with small critical dimension. As a result, the etch depths for trenches 170, "A", are usually larger than the etch depths for trenches 178, "B", with the difference as "D". Since a typical metal interconnect level includes critical dimensions of various sizes, the problems with micro-loading create a disparity in trench depth in relation with feature sizes, and ultimately poor sheet resistance control of the integrated circuit devices.

Therefore, there is a need for a method of uniformly fabricating a dual damascene structure to form a desired dimension and profile of material stacks and to control the etch depths in the vias and trenches.

SUMMARY OF THE INVENTION

Embodiments of the invention provide methods and apparatuses for controlling the etch depth during etching of trenches over vias in fabricating a dual damascene structure on a substrate. In a dielectric film stack where no middle etch stop layer is used during dual damascene fabrication, etch depth across features of different critical dimension varies between dense areas and open areas on the surface of the substrate, resulting in micro-loading where large critical dimension area are etched faster than small critical dimension areas. Embodiments of the present invention achieve the same etch depth over dense areas and open areas of a substrate during trench over via etch of a dual damascene structure.

In some embodiments, the trench etch process is adapted to include a forward micro-loading etching process and a reverse micro-loading etching process using two etch chemistries together with the inclusion of a dopant material layer or an organic fill material layer during the deposition of the dielectric film stack. In one embodiment, etching of trenches over vias is switched from forward micro-loading to reverse micro-loading or vice versa once etching of the dielectric film stack is reached at a predetermined location of a dopant material layer. In another embodiment, etching of an organic trench filling material layer is performed in a reverse micro-loading process followed by etching the dielectric film stack in a forward micro-loading process or vice versa.

In one embodiment, a method of forming a dual damascene structure on the surface of a substrate includes depositing a dopant material layer into a dielectric film stack deposited over a bottom barrier layer on the surface of the substrate, depositing a top layer over the dielectric film stack, performing via lithography and via etch into the dielectric film stack, performing trench lithography on the top layer to form a trench pattern, and performing a forward micro-loading trench etch process using a first trench etch chemistry where open area on the trench pattern are etched faster than dense area on the trench pattern until the first trench etch process reaches the dopant material layer within the dielectric film stack. The method further includes performing a reverse micro-loading trench etch process using a second trench etch chemistry where the open area on the trench pattern are etched slower than the dense area to obtain the same trench etch depth in the dense area and the open area of the dielectric film stack. The two trench etch processes and chemistries for the dielectric film stack can also be performed in reverse manner.

In another embodiment, a method of forming a dual damascene structure on the surface of a substrate includes depositing a polish stop layer over a dielectric film stack deposited over a bottom barrier layer on the surface of the substrate, performing via lithography and via etch into the polish stop layer and the dielectric film stack, depositing an organic fill material layer over the polish stop layer to fill vias in the dielectric film stack, depositing a top layer over the organic fill material layer, and performing trench lithography on the top layer to form a trench pattern. The method further includes performing a reverse micro-loading trench etch process using an etch chemistry adapted to etch the organic fill material layer where open area on the trench pattern are etched slower than dense area on the trench pattern; and residual organic fill materials from a portion of the organic fill material layer are left on the open area, and performing a forward micro-loading trench etch process using a trench etch chemistry adapted to etch the dielectric film stack where the open area on the trench pattern are etched faster than the dense area on the trench pattern to obtain the same trench etch depth in the dense area and the open area of the dielectric film stack. The two trench etch processes for the organic fill material layer and the dielectric film stack can be also performed in reverse manner.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the invention provide methods and apparatuses for fabricating a dual damascene structure on a substrate using a reverse micro-loading etching process to control the etch depth during trench over via etch of a dual damascene structure with no middle etch stop layer. As a result, the dense area and the open area of the substrate are etched to the same etch depth and good patterned profiles of via openings and trench openings of a dual damascene structure are provided with no damage to the patterned profile of a dielectric film stack having one or more low-k dielectric material layers.

In practice, the micro-loading problem for trench etching a given substrate can be studied and characterized, and based on the micro-loading data, a dopant material layer or an organic fill material layer can be introduced during the deposition process for a dielectric film stack in order to optimize the appropriate height/location of the dopant material layer within the dielectric film stack or the thickness of the organic fill material layer on top of the dielectric film stack. For example, the required etch depth and the etch depths in a trench etch process having micro-loading problems may need to be characterized initially. The difference in height "D" between the etch depths for open area trenches and dense area trenches for etching the trenches of a given substrate may need to be measured. The open area of a trench pattern generally include large critical dimension and the dense area of a trench pattern generally include a small critical dimension. In a trench etch process with micro-loading problem, the open area with large critical dimension may be etched much faster than the dense area, and it is very difficult to fix the micro-loading problem during trench etching of the dielectric film stack because there is no end point to adjust or reverse the forward micro-loading problem within a homogeneous dielectric material in the dielectric film stack.

In one embodiment, correcting micro-loading using a reverse micro-loading etching process requires doping a dielectric film stack with a dopant material layer at a predetermined location during the deposition of the dielectric film stack. When etching a trench into the dielectric film stack during fabrication of a dual damascene structure, the dopant material layer serves as an end point for a trench etch process with forward micro-loading. The open area of large critical dimension is etched faster than the dense area of small critical dimension. Once the trench etch process reaches the dopant material layer, etching of trenches over vias can be switched from a forward micro-loading trench etch process using a first trench etch chemistry to a reverse micro-loading trench etch process using a second trench etch chemistry. The height of the dopant material layer within the dielectric film stack is adjusted such that even though there is micro-loading during etching with the first trench etch chemistry, etching can be switched to the second etch chemistry to reverse micro-loading after etching of the dielectric film stack reaches the location of the dopant material layer.

In another embodiment, an organic fill material layer may be deposited over an etch stop layer on top of a dielectric film stack. Trench etching of an organic filling material layer according to a trench pattern of a patterned top layer or a patterned hard-mask layer thereon may then be performed in a reverse micro-loading manner followed by trench etching in the dielectric film stack in a forward micro-loading manner, or vice versa.

Figure 2A:
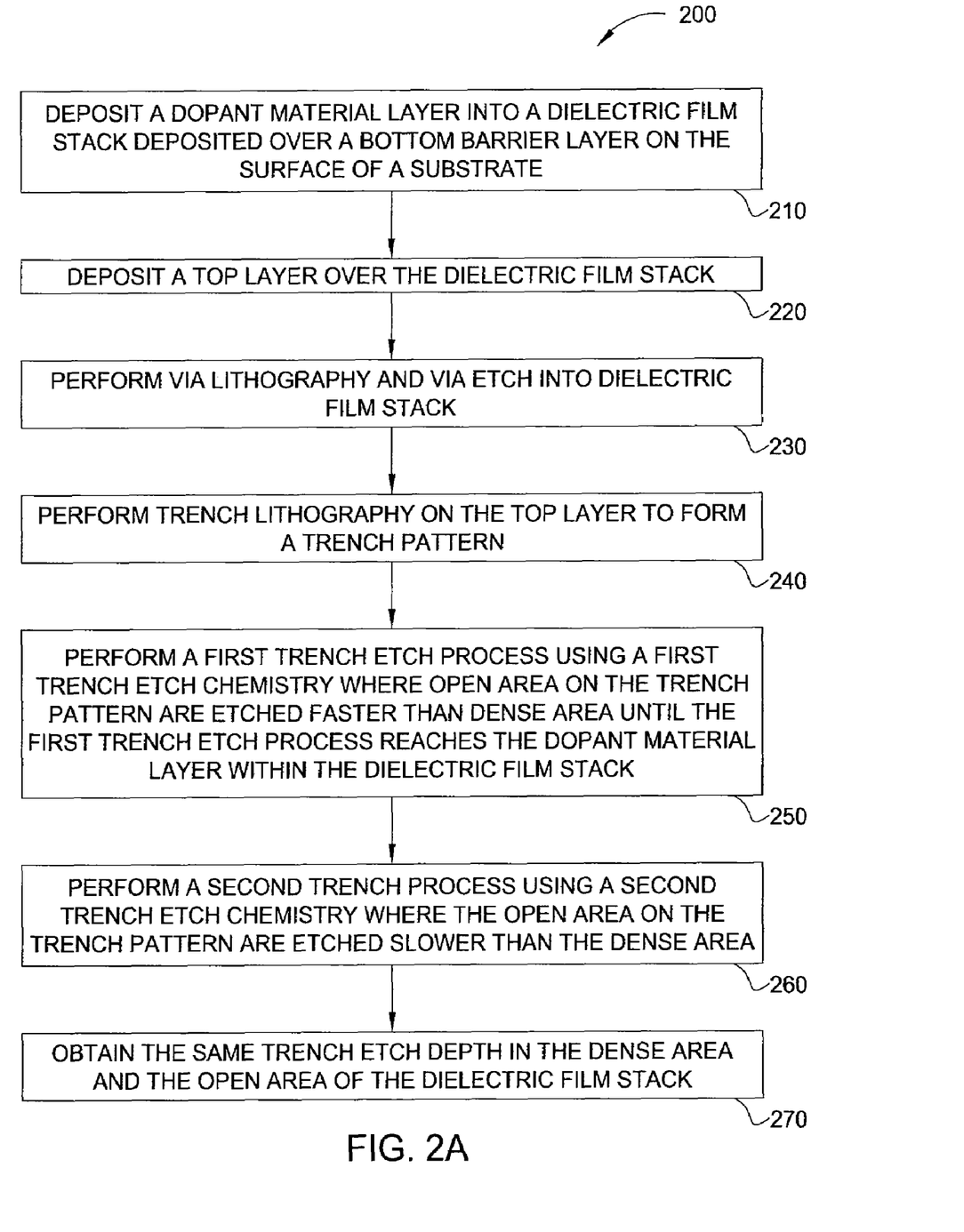
FIG. 2A is an exemplary process flow diagram of a method for fabricating and etching a dual damascene structure according to one or more embodiments of the invention.

FIG. 2A demonstrates a method 200 for fabricating and etching a dual damascene structure according to one or more embodiments of the invention. The method 200 is compatible with various film deposition and etching processes as well as various damascene fabrication schemes, such as via first fabrication schemes, BARC etch-back fabrication schemes, dual hard mask fabrication schemes, tri-layer fabrication schemes, dual hard mask transfer fabrication schemes, etc.

At step 210, a dopant material layer is deposited into a dielectric film stack at a predetermined location during the deposition of the dielectric film stack. The dielectric film stack is deposited on the surface of a substrate, such as a substrate having a bottom barrier layer deposited thereon. Chemical vapor deposition, spin-on, and other film deposition processes can be used to deposit one or more layers of the dielectric film stack of the invention.

The dielectric film stack may include a dielectric bulk insulating layer disposed over an optional dielectric bottom barrier layer. Examples of suitable materials for the dielectric bulk insulating layer include, but are not limited to, organosilicate materials, porous oxide materials, silsesquioxane materials, parylene, carbon-doped dielectrics materials (e.g., carbon-doped organo-silicate glass (OSG), carbon-doped silicon dioxide, etc.), spin-on glass materials (e.g., un-doped silicon glass (USG), a fluorine-doped silicon glass (FSG), etc.), carbon containing silicon materials, silicon oxycarbides (SiOC), and combinations thereof. In one embodiment, the dielectric bulk insulating layer is a dielectric material having a low dielectric constant, such as less than 7.0, e.g, a dielectric constant between about 2 to about 5. Examples of an organosilicate-based low-k carbon-containing silicon oxides (SiOC) dielectric material include BLACK DIAMOND® I and BLACK DIAMOND® II available from Applied Materials, Inc., of Santa Clara, Calif.

In one embodiment, the dopant material layer may include a trace element. The dopant material layer may be deposited by chemical vapor deposition during the deposition of the dielectric film stack by introducing the trace element together with precursor gases for a predetermined time period at a predetermined location of the dielectric film stack. In another embodiment, the dopant material layer may be deposited into a thin film at a predetermined location/height during the deposition of the dielectric film stack. The thin film of the dopant material layer may be deposited by any deposition methods, such as chemical vapor deposition, physical vapor deposition, among others.

The substrate may be, for example, a silicon wafer or glass substrate of any desirable sizes, and may include one or more dielectric layers having a conductive feature, such as metal lines, thereon. Optionally, the surface of the substrate may include the bottom barrier layer, which may comprise a dielectric material, including carbon containing silicon materials, silicon oxycarbides (SiOC), silicon carbides, silicon nitrides (SiN), carbon containing silicon nitride materials (SiCN), and combinations thereof, among others. One exemplary material for the bottom barrier/liner layer is a BLOk™ (barrier low-k) film, which is a silicon carbide film available from Applied Materials, Inc., Santa Clara, Calif. The bottom barrier layer may be treated with a plasma to improve its adhesion to the substrate.

The dielectric film stack of the invention may optionally include an etch stop layer and a second dielectric bulk insulating layer deposited over the dielectric bulk insulating layer to assist in forming and patterning trenches and vias on the surface of the substrate. Exemplary materials for the optional etch stop layer include silicon nitrides, silicon dioxides, tetra-ethyl-ortho-silicate (TEOS) based oxides, silicon carbides, silicon oxycarbide, and the like. The second dielectric bulk insulating layer may comprise dielectric materials having low dielectric constant and may include the same or different material as the dielectric bulk insulating layer described above. For example, the dielectric film stack of the invention may include a first dielectric bulk insulating layer having a dielectric constant between about 2 and about 7 (e.g., about 3) and a second dielectric bulk insulating layer having a dielectric constant between about 2 to about 5 (e.g., about 2.3).

At step 220, a top layer is deposited over the dielectric film stack. The top layer, which may comprise a dielectric material, including silicon oxynitrides (SiON), carbon containing silicon materials, silicon oxycarbides (SiOC), silicon carbides, silicon nitrides (SiN), carbon containing silicon nitride materials (SiCN), silicon oxide ($SiO_2$), tetra-ethyl-ortho-silicate (TEOS) based oxide, and combinations thereof, among others. The top layer is deposited over the surface of the substrate to protect the dielectric film stack, such as a dielectric bulk insulating layer, and may be fabricated as one or more layers, such as a single layer of dielectric capping materials or two layers of hard mask materials, depending on the applications for dual damascene structures to be fabricated and the fabrication schemes used for forming the dual damascene structures of the invention. The top layer may also include one or more layers of antireflective materials. The top dielectric layer generally comprises a material that has good etch selectivity to the dielectric bulk insulating layer.

Additionally, one, two or more layers of hard mask materials may be deposited above the dielectric film stack; for example, two different hard mask materials that have good etch selectivity with respect to the dielectric bulk insulating layer and different CMP polishing selectivity with respect to the each other can be used. Exemplary materials to be deposited as a hard mask layer over the dielectric bulk insulating layer may include silicon oxide ($SiO_2$), silicon oxynitrides (SiON), carbon containing silicon materials, silicon oxycarbides (SiOC), silicon carbides, silicon nitrides (SiN), carbon containing silicon nitride materials (SiCN), tetra-ethyl-ortho-silicate (TEOS) based oxide, and Black Diamond™ dielectric, among others. Other materials to be deposited as a second hard mask layer over the hard mask layer may include titanium nitride, tantalum nitride, titanium, tungsten, tantalum, tungsten nitride, amorphous silicon, and silicon oxide, among others.

At step 230, via lithography and via etch are performed into the dielectric film stack. Resist materials may be used to form a via pattern on the surface of the substrate. Etching of the dielectric film stack is performed according to the via pattern.

At step 240, trench lithography is performed on the top layer to form a trench pattern on the surface of the substrate. In addition, resist materials may be used during trench lithography to form the trench pattern.

At step 250, a first trench etch process is performed using a first trench etch chemistry to etch the dielectric film stack. The first trench etch process may generate a forward micro-loading trench etch profile, where open areas on the trench pattern are etched faster than dense areas on the trench pattern until the first trench etch process reaches the dopant material layer within the dielectric film stack.

At step 260, a second trench etch process is performed using a second trench etch chemistry for the dielectric film stack to generate a reverse micro-loading trench etch profile. Open areas on the trench pattern are etched slower than dense areas resulting in the same trench etch depth in dense and open areas of the dielectric film stack.

In one embodiment, the dopant material layer may serve as an end-point for the forward micro-loading trench etch process and as an indicator to start a reverse micro-loading trench etch process. The location of the dopant material layer in the dielectric film stack, the reverse micro-loading etch rate, and the time when the reverse micro-loading process is initiated may be adjusted such that at the end of the first and the second trench etch process, the dense area and the open area have the same etch depth. The height of the dopant (within the via dielectric) is adjusted such that an end-point is triggered. Once the end-point is triggered, the etch chemistry is changed from the first trench etch chemistry to the second trench etch chemistry to begin the reverse micro-loading etch process. The presence of the dopant material layer in the dielectric film stack may act as a marker or end point and initiate switching from the first trench etch chemistry which etches the open area faster than the dense area to the second trench etch chemistry which etches the open area slower than the dense area. Alternatively, the order for obtaining the forward and reverse micro-loading trench etch profiles may be reversed.

In an alternative embodiment, the first and the second trench etch chemistries for etching the dielectric film stack may be the same or similar, such as including similar or the same etching gases. However, once etching of the dielectric film stack reaches the dopant material layer and the etching front hits the dopant material layer in the dielectric film stack, the dopant material layer may chemically interact with the etching gases in the first trench etch chemistry such that the etch rate in the open area becomes slower in relation to the etch rate in the dense area to start a reverse micro-loading trench etch process. With proper adjustment of the location and concentration of the dopant material layer, etching of the dielectric film stack is changed from a forward micro-loading etch process to a reverse micro-loading etch process without the need to change the flow rate of the etching chemistry or the pressure inside an etch chamber, or other factors affecting the trench etch of the dielectric film stack. The presence of the dopant material layer in the dielectric film stack may cause the trench etch process to slow down in the open area without impacting the trench etch in the dense area.

Figure 2B:
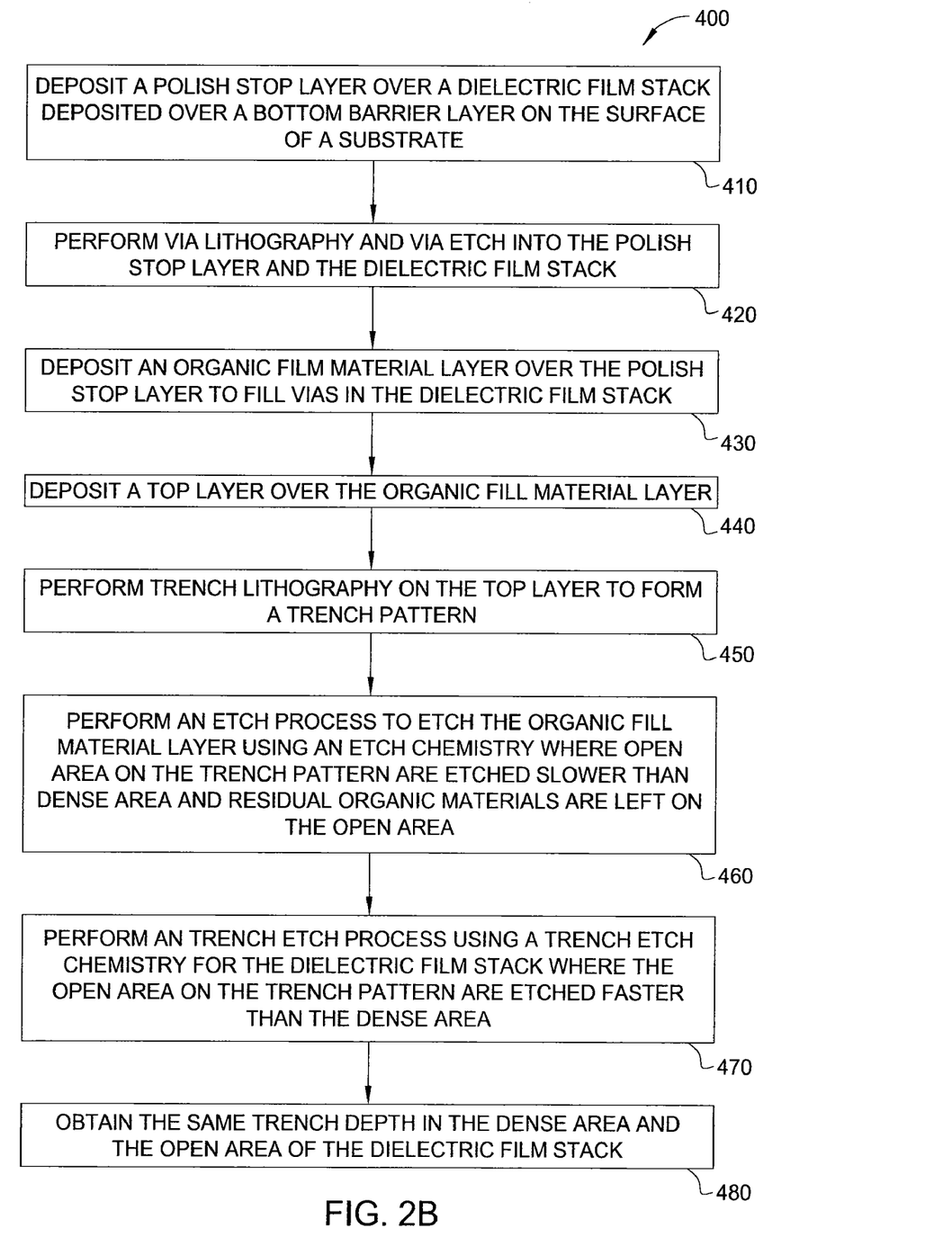
FIG. 2B is an exemplary process flow diagram of a method for fabricating and etching a dual damascene structure according to one or more embodiments of the invention.

FIG. 2B demonstrates a method 400 for fabricating and etching a dual damascene structure according to one or more embodiments of the invention. The method 400 of the invention is compatible with various film deposition and etching processes as well as various damascene fabrication schemes, such as via first fabrication schemes, BARC etch-back fabrication schemes, dual hard mask fabrication schemes, tri-layer fabrication schemes, dual hard mask transfer fabrication schemes, etc.

At step 410, a polish stop layer is deposited over a dielectric film stack disposed over a bottom barrier layer on the surface of the substrate. At step 420, via lithography and via etch into the polish stop layer and the dielectric film stack are performed. The polish stop layer generally includes such materials as silicon oxy-nitride (SiON), tetra-ethyl-ortho-silicate (TEOS) based oxide, silicon carbide, silicon dioxide, silicon nitride, silicon oxycarbide, and the like. The bottom barrier layer may comprise a dielectric material, including carbon containing silicon materials, silicon oxycarbides (SiOC), silicon carbides, silicon nitrides (SiN), carbon containing silicon nitride materials (SiCN), and combinations thereof, among others. One exemplary material for the bottom barrier/liner layer is a BLOk™ (barrier low-k) film, which is a silicon carbide film available from Applied Materials, Inc., Santa Clara, Calif. The bottom barrier layer may be treated with a plasma to improve its adhesion to the substrate.

At step 430, an organic fill material layer is deposited over the polish stop layer to fill vias in the dielectric film stack. The organic fill material layer may include a bottom anti-reflective coating (BARC) layer, an organic resist material layer, or an organic resin layer, deposited to fill the vias. The organic fill material layer may be used to protect the vias formed in the dielectric film stack from damage during subsequent etching processes. It may also be used as a material layer for performing a reverse micro-loading trench etch process. When BARC materials are used as the organic material layer, the BARC materials can be used to control reflections from the underlying dielectric film stack during lithography processes. The BARC layer may include, but are not limited to, an organic material, such as polyamides and polysulfones materials containing hydrogen and carbon elements, or an inorganic material, such as silicon nitrides, silicon oxynitrides, silicon carbides, among others. The BARC layer may be applied by spinning-on the substrate to fill the trenches, or, alternatively, the BARC layer may be coated, deposited, or filled in the trenches in any other suitable manner.

At step 440, a top layer is deposited over the organic fill material layer and at step 450, trench lithography is performed on the top layer to form a trench pattern. The top layer may include a dielectric material, such as silicon oxynitrides (SiON), carbon containing silicon materials, silicon oxycarbides (SiOC), silicon carbides, silicon nitrides (SiN), carbon containing silicon nitride materials (SiCN), silicon oxide ($SiO_2$), tetra-ethyl-ortho-silicate (TEOS) based oxide, and combinations thereof, among others. The top layer is deposited over the surface of the substrate to protect the organic fill material layer and the dielectric film stack and serve as a mask layer for transferring the trench pattern over to the organic fill material layer. The top layer may be fabricated as one or more layers, such as a single layer of dielectric capping materials, two layers of hard mask materials, or one or more layers of antireflective materials, depending on the applications for dual damascene structures to be fabricated and the fabrication schemes used for forming the dual damascene structures of the invention. The top dielectric layer generally comprises a material that has good etch selectivity to the material for the dielectric film stack.

At step 460, a first trench etch process using an etch chemistry adapted to etch the organic fill material layer is performed such that dense area on the trench pattern are etched slower than open areas on the trench pattern and residual organic fill materials from a portion of the organic fill material layer are left on the dense area. Optionally, the thickness of the residual organic fill materials left on the dense area is the same as the difference "D" which are characterized for etching the dielectric film stack with micro-loading problems.

Figure 5:
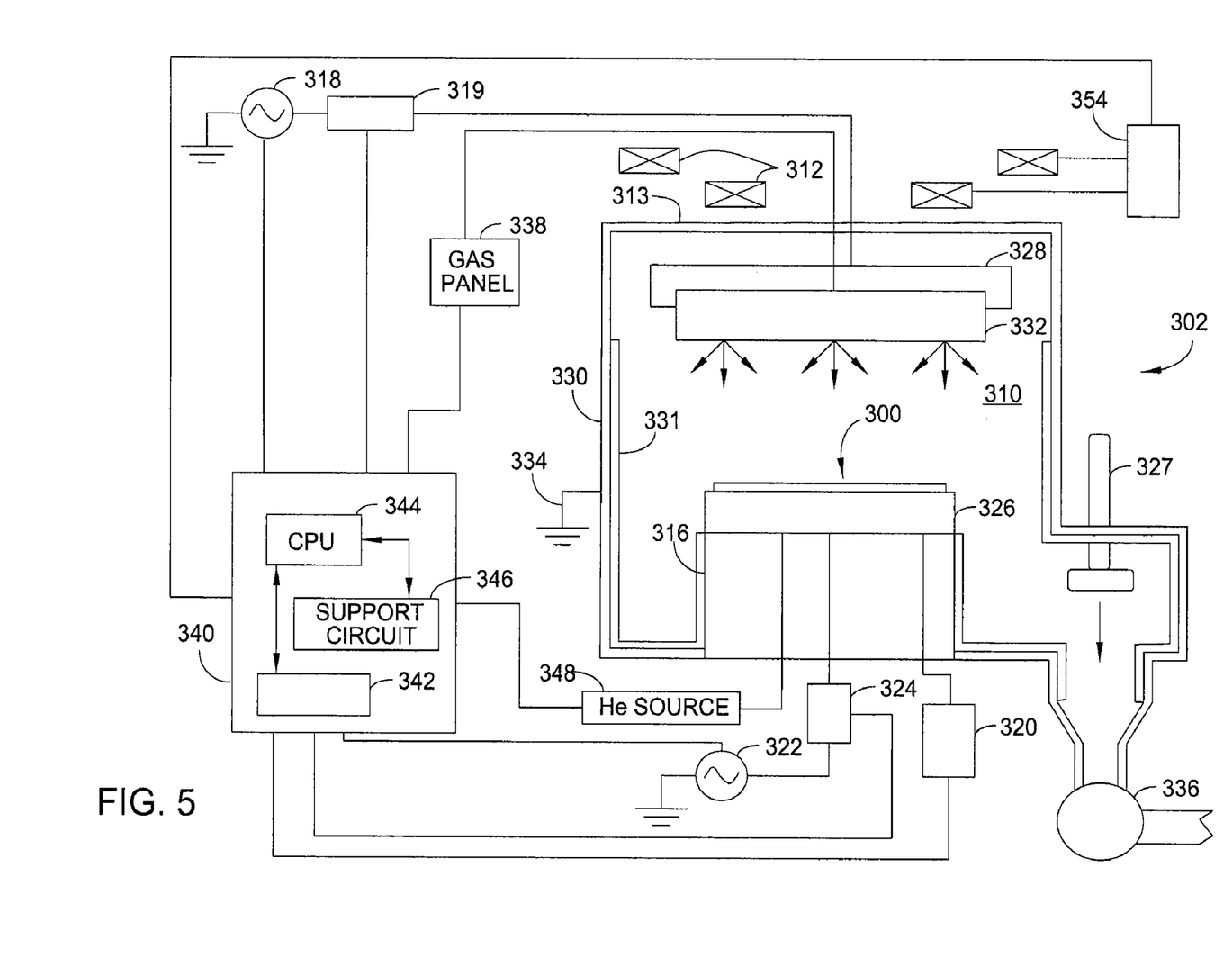
FIG. 5 is a schematic cross-sectional view of a plasma etch reactor used according to one embodiment of the invention.

For example, the organic fill material layer can be etched by forming a plasma from a gas mixture having a nitrogen-containing gas, such as $NH_3$ gas, a hydrogen-containing gas, and an oxygen-containing gas, such as CO or $O_2$, or a combinations thereof, in an etch chamber, such as the chamber as described in FIG. 5, or in other suitable reactors. One example of a gas mixture for etching the organic fill material layer includes $NH_3$, CO and $O_2$. Another example for etching the organic fill material layer includes a mixture of hydrogen gas ($H_2$) and nitrogen gas ($N_2$). In addition, one or more fluorocarbon gases, such as $CF_4$, $C_2F_6$, $C_2F_8$, $C_3F_8$, $C_4F_{10}$, $C_4F_8$, $CHF_3$, or combinations thereof, can also be included in the gas mixture to etch the bulk dielectric insulating layer organic fill material layer. The etching gas mixture may further include an inert gas, such as helium, argon, neon, xenon, and krypton, of which argon is most often used.

At step 470, a second trench etch process using a trench etch chemistry adapted to etch the dielectric film stack is performed such that the dense area on the trench pattern is etched faster than the open area on the trench pattern. As an example, a mixture of at least about 500 sccm of argon, between about 4 and about 400 sccm of $CF_4$, between about 0 and about 200 sccm of $CH_2F_2$, between about 0 to about 400 sccm of N2 can be used to etch the bulk dielectric insulating layer. However, other suitable etch chemistries can also be used.

At step 480, the same trench etch depths are obtained in the dense area and the open area of the dielectric film stack. The use of a reverse micro-loading trench etch process for etching the organic fill material layer and a forward micro-loading trench etch process to etch the dielectric film stack provides good patterned profiles of the via and trench openings of a dual damascene structure on the surface of the substrate.

The methods 200 and 400 offer the advantages of good etching profiles, smooth resulting trench etch surfaces, no damages to the low k dielectric bulk insulating layer from etching of the bottom barrier layer, and no micro-loading problems during trench etch. The methods may be stored in memory or computer readable medium as instructions such that, when executed by a controller, the methods can be performed in process chambers, film deposition chambers, etch chambers, and the like.

Embodiments of the invention provide methods and apparatuses for controlling the etch depth during etching of trench over via in fabricating a dual damascene structure on a substrate. When no middle etch stop layer in a dielectric film stack is used during dual damascene fabrication, etch depth across features of different critical dimension varies between dense areas and open areas on the surface of the substrate, resulting in problems such as micro-loading where large critical dimension areas are etched faster than small critical dimension areas.

Figure 3A:
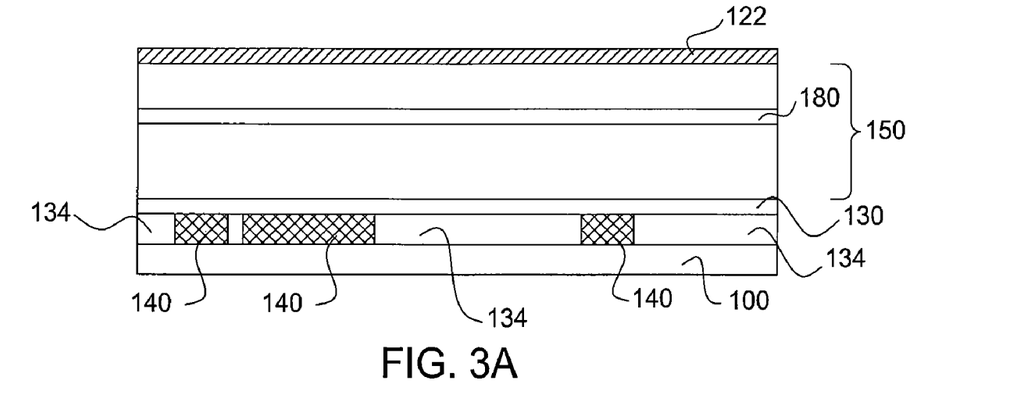
FIGS. 3A-3C are sectional views of a dual damascene structure sequentially fabricated and etched according to one or more embodiments of the invention.
Figure 3B:
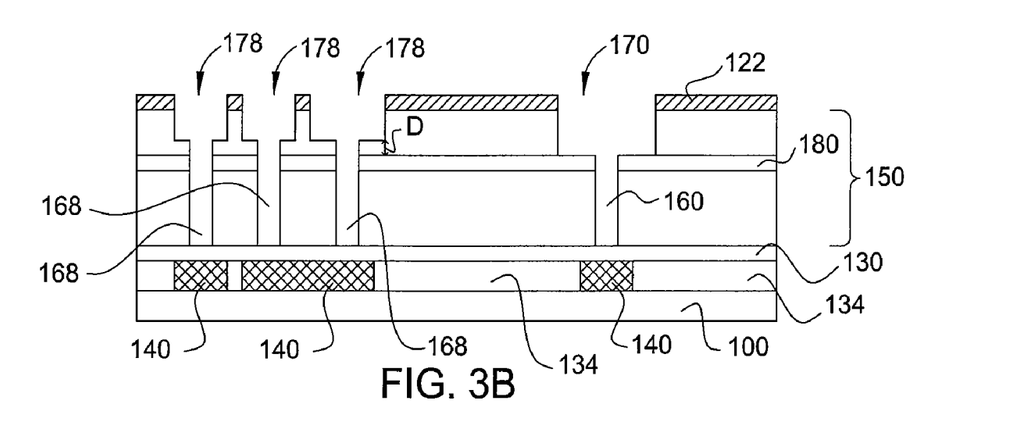
Figure 3C:
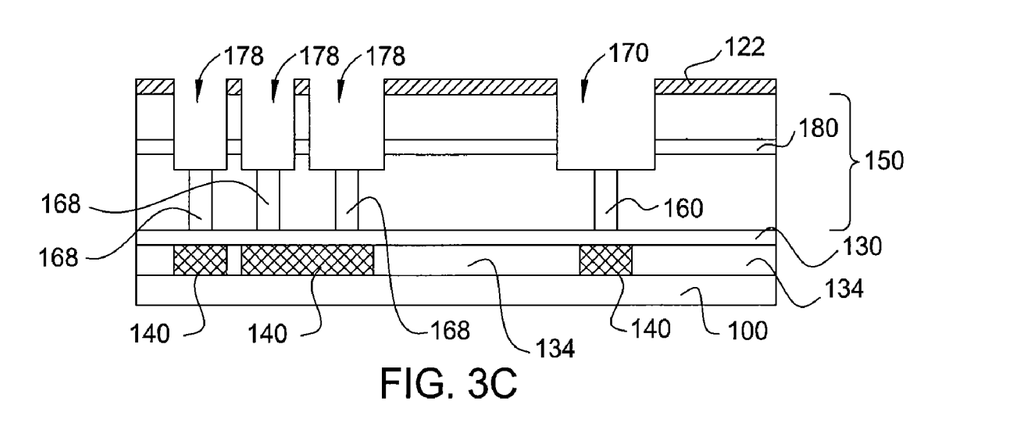

FIGS. 3A-3C are sectional views during different stages of an exemplary dual damascene structure sequentially fabricated and etched on the surface of a substrate using the exemplary method 200 according to one or more embodiments of the invention. The substrate may include a dielectric base layer 134 having at least a layer of metal lines 140, such as copper lines, therein. The substrate may also include a bottom barrier layer 130.

As shown in FIG. 3A, a dielectric film stack 150 deposited over the surface of the substrate may include a bulk dielectric insulating material and a dopant material layer 180. The location of the dopant material layer 180 may be predetermined according to a test trench etch profile of the dielectric film stack 150 having micro-loading problem. A top layer 122 may be sequentially deposited over the dielectric film stack 150 on the surface of the substrate.

Via lithography and via etch may be performed into the dielectric film stack to form vias 160 in the open area with large critical dimension and vias 168 in the dense area with small critical dimension. Trench lithography may also be performed on the top layer 122 to for a trench pattern for etching trenches into the dielectric film stack 150.

As shown in FIG. 3B, a first trench etch process may be performed to etch the dielectric film stack 150, where trenches 170 in the open area are etched faster than trenches 178 in the dense area, until the etch front reaches the dopant material layer 180. The first trench etch process is performed in a forward-micro-loading manner and the difference "D" for the etch fronts between the trenches 170 and the trenches 178 is also shown in FIG. 3B.

Then, a second trench etch process is performed to reverse the micro-loading process. As shown in FIG. 3C, a second trench etch chemistry for the dielectric film stack 150 can be used to perform a reverse micro-loading trench etch process such that the trenches 178 in the dense area are etched faster than the trenches 170 in the open area and finally reaches to the same etch depths as the trenches 170.

FIGS. 4A-4D are sectional views during different stages of an exemplary dual damascene structure sequentially fabricated and etched on the surface of a substrate using the exemplary method 400 according to one or more embodiments of the invention. The substrate may include a dielectric base layer 134 having at least a layer of metal lines 140, such as copper lines, therein. The substrate may also include a bottom barrier layer 130. The examples as shown in FIGS. 4A-4D is particularly applicable to a scheme called the tri-layer scheme having via filled with an organic fill material layer.

Figure 4A:
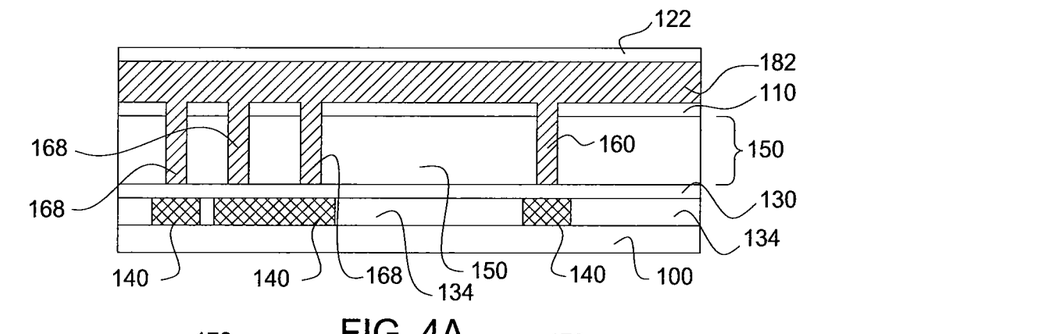
FIGS. 4A-4D are sectional views of a dual damascene structure sequentially fabricated and etched according to one or more embodiments of the invention.

For example, as shown in FIG. 4A, a dielectric film stack 150 and a polish stop layer and/or an etch stop layer 110 may be deposited over the bottom barrier layer 130 on the surface of the substrate. The dielectric film stack may include a bulk dielectric insulating material. Via lithography and via etch are performed to form vias 160 in the open area and vias 168 in the dense area into the dielectric film stack 150 and the etch stop layer 110.

In addition, an organic fill material layer 182 may be deposited sequentially over the dielectric film stack 150 to fill the vias 160 and the vias 168. Then, a top layer 122 or a hard mask layer may be deposited over the organic fill material layer 182. Trench lithography is then performed over the surface of the substrate to form a trench pattern on the top layer 122. The trench pattern on the top layer 122 is used to transfer the trench pattern to the organic fill material layer 182, and the organic fill material layer 182 is used to transfer the trench pattern to the dielectric film stack 150.

Figure 4B:
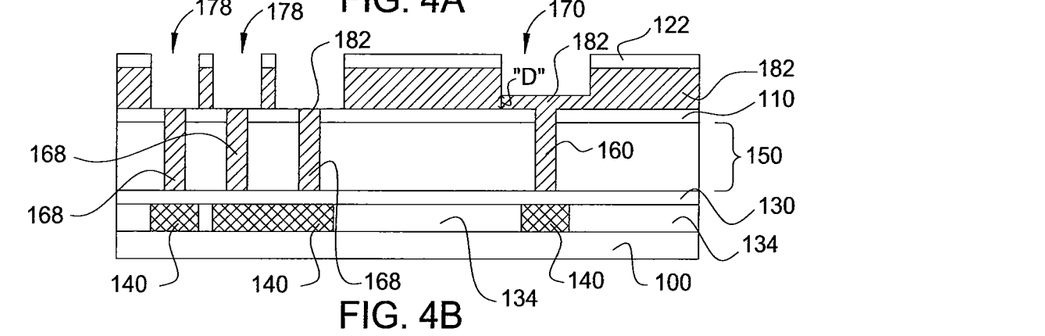

As shown in FIG. 4B, etching of the organic fill material layer 182 is performed using an etch chemistry such that the trenches 170 in the open area are etched slower than the trenches 178 in the dense area. According to one embodiment of the invention, the pattern transfer from the top layer 122 to the organic fill material layer 182 is designed to have reverse micro-loading etch profile such that once the pattern transfer process is complete, the dense areas are cleared of the fill material, while the open area has a thickness of fill material left which is equal to the forward micro-loading between the dense area and the open area for the pattern transfer from the organic fill material layer 182 into the dielectric film stack 150 having trench definitions therein. A forward micro-loading trench etch process for etching the dielectric film stack 150 is then followed in order to obtain equal etch depths for the trenches 170 in the open area and the trenches 178 in the dense area at the end of the dielectric trench etch process.

Etching of the organic fill material layer 182 is performed in a reverse-micro-loading manner and the difference "D" for the etch fronts between the trenches 170 and the trenches 178 is also shown in FIG. 4B. Residual organic fill materials are left in the open area with large critical dimension of features.

Figure 4C:
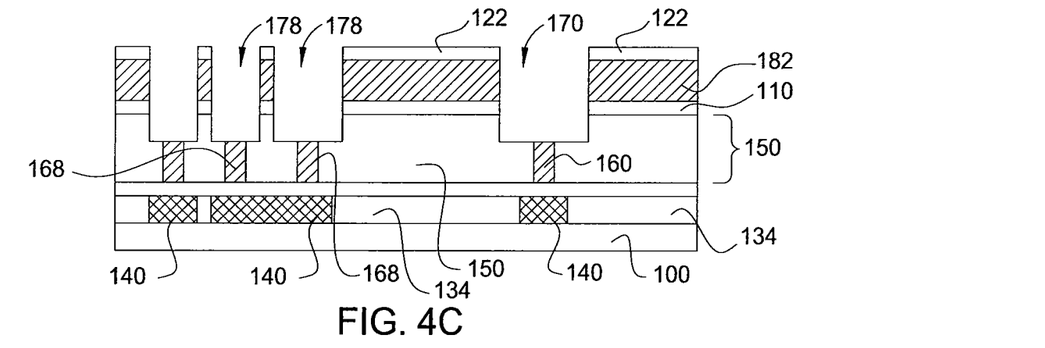

As shown in FIG. 4C, a trench etch process is performed to etch the dielectric film stack 150, where trenches 170 in the open area are etched faster than trenches 178 in the dense area, until the etch front reaches the dielectric film stack 150 and the same etch depths for the trenches 170 and the trenches 178 are obtained.

Figure 4D:
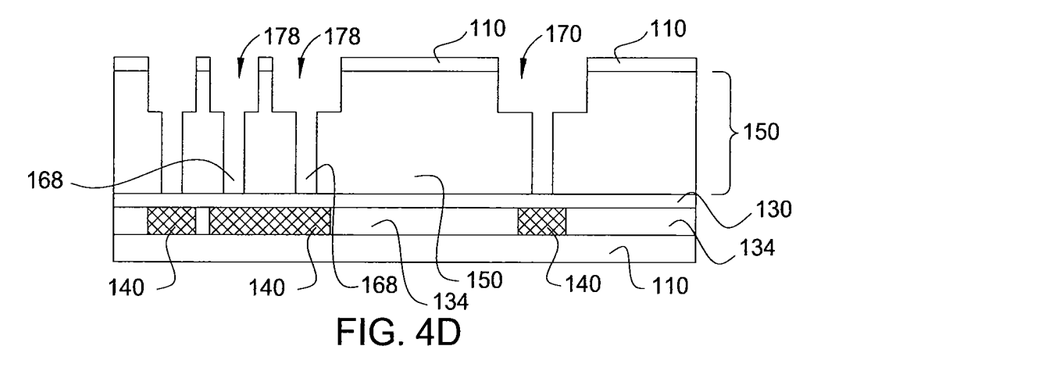

As shown in FIG. 4D, the remaining portion of the organic fill material layer 182 can be stripped away easily, leaving the same trench depths for the trenches 170 and the trenches 178. Once trenches are formed to the same depths, etching of the bottom barrier layer 130 can be easily performed with no micro-loading problems.

FIG. 5 depicts a schematic cross-sectional view of one embodiment of a plasma etch chamber 302 suitable for performing one or more embodiments of the invention. One exemplary plasma etch chamber is an ENABLER® processing chamber, available from Applied Materials, Inc., of Santa Clara, Calif. It is contemplated that other etch reactors, including those from other manufacturers, may be adapted to perform processes provided by embodiments of the invention. The plasma etch chamber 302 may include a process chamber 310 having a conductive chamber wall 330. The temperature of the chamber wall 330 may be controlled using liquid-containing conduits (not shown) that are located in and/or around the conductive chamber wall 330.

The process chamber 310 is a vacuum vessel that is coupled through a throttle valve 327 to a vacuum pump 336. The conductive chamber wall 330 is connected to an electrical ground 334. A liner 331 is disposed in the process chamber 310 to cover the interior surfaces of the conductive chamber wall 330. Liner 331 facilitates cleaning process chamber 310.

Process chamber 310 also includes a support pedestal 316 and a showerhead 332. The support pedestal 316 supports a substrate 300 below the showerhead 332 in a spaced-apart relation during processing. The support pedestal 316 may include an electrostatic chuck 326 for retaining the substrate 300. Power to the electrostatic chuck 326 is controlled by a DC power supply 320. The support pedestal 316 is coupled to a radio frequency (RF) bias power source 322 through a matching network 324. The bias power source 322 is generally capable of producing an RF signal having a tunable frequency of from about 50 kHz to about 60 MHz and a bias power of about 0 to 5,000 Watts. Optionally, the bias power source 322 may be a DC or pulsed DC source.

The temperature of the substrate 300 supported on the support pedestal 316 is at least partially controlled by regulating the temperature of the support pedestal 316. In one embodiment, the support pedestal 316 includes a cooling plate (not shown) having channels formed therein for flowing a coolant. In addition, a backside gas, such as helium (He) gas from a gas source 348, is provided into channels disposed between the back side of the substrate 300 and grooves (not shown) formed in the surface of the electrostatic chuck 326. The backside helium gas provides efficient heat transfer between the support pedestal 316 and the substrate 300. The electrostatic chuck 326 may also include a resistive heater (not shown) within the chuck body to heat the electrostatic chuck 326. In one embodiment, the substrate 300 is maintained at a temperature of between about 10 to about 500 degrees Celsius.

The showerhead 332 is mounted to a chamber lid 313 of the process chamber 310. A gas panel 338 is fluidly coupled to a plenum (not shown) defined between the showerhead 332 and the chamber lid 313. The showerhead 332 includes a plurality of holes to allow gases, provided to the plenum from the gas panel 338, to enter the process chamber 310. The holes in the showerhead 332 may be arranged in different zones such that various gases can be released into the process chamber 310 with different volumetric flow rates. The showerhead 332 and/or an upper electrode 328 positioned proximate thereto is coupled to an RF source power 318 through an impedance transformer 319 (e.g., a quarter wavelength matching stub). The RF power source 318 is generally capable of producing an RF signal having a tunable frequency of about 160 MHz and a source power of about 0 to 5,000 Watts.

The plasma etch chamber 302 may also include one or more coil segments or magnets 312 positioned exterior to the conductive chamber wall 330, near the chamber lid 313. Power to the magnets 312 is controlled by a DC power source or a low-frequency AC power source 354. During processing, gas pressure within the interior of the process chamber 310 is controlled using the gas panel 338 and the throttle valve 327. In one embodiment, the gas pressure within the interior of the process chamber 310 is maintained at about 0.1 to 999 mTorr.

A controller 340, including a central processing unit (CPU) 344, a memory 342, and support circuits 346, is coupled to the various components of the plasma etch chamber 302 to facilitate control of the processes of the present invention. The memory 342 can be any computer-readable medium, such as random access memory (RAM), read only memory (ROM), floppy disk, hard disk, or any other form of digital storage, local or remote to the plasma etch chamber 302 or CPU 344. The support circuits 346 are coupled to the CPU 344 for supporting the CPU in a conventional manner. These circuits include cache, power supplies, clock circuits, input/output circuitry and subsystems, and the like. A software routine or a series of program instructions stored in the memory 342, when executed by the CPU 344, causes the plasma etch chamber 302 to perform processes of the present invention.

FIG. 5 only shows one exemplary configuration of various types of plasma reactors that can be used to practice the invention. For example, different types of source power and bias power can be coupled into the plasma chamber using different coupling mechanisms. Using both the source power and the bias power allows independent control of a plasma density and a bias voltage of the substrate with respect to the plasma. In some applications, the source power may not be needed and the plasma is maintained solely by the bias power. The plasma density can be enhanced by a magnetic field applied to the vacuum chamber using electromagnets driven with a low frequency (e.g., 0.1-0.5 Hertz) AC current source or a DC source. In other applications, the plasma may be generated in a different chamber from the one in which the substrate is located, e.g., remote plasma source, and the plasma subsequently guided into the chamber using techniques known in the art.

Other process chambers, such as Chemical Vapor Deposition (CVD) chambers, Plasma Enhanced Chemical Vapor Deposition (PECVD) chambers, Physical Vapor Deposition (PVD) chambers, etc., suitable for performing one or more steps of the invention, are also available from Applied Materials, Inc. of Santa Clara, Calif. For example, for depositing the bottom barrier layer, dielectric bulk low-k insulating layer, top dielectric layer, the dielectric film stack, and other dielectric layers of the invention, suitable silicon-based process precursors, organosilicon compounds, and other process gases can be introduced into a deposition chamber, such as PRODUCER plasma enhanced chemical vapor deposition chamber (PECVD) chamber, which is commercially available from Applied Materials, Inc. of Santa Clara, Calif.

Optionally, the surface of the substrate can be cleaned and the film stack may be annealed once the trench pattern is formed on the surface of the substrate. For example, the substrate can be cleaned with a surface-cleaning solution inside a wet clean chamber and annealed in an annealing chamber. Examples of wet clean chambers and annealing chambers are available from Applied Materials, Inc. of Santa Clara, Calif.

Etching techniques that may be used to fabricate the dual damascene structures of the present invention may be practiced, for example, in a processing system such as a CENTURA® semiconductor wafer processing system commercially available from Applied Materials, Inc. of Santa Clara, Calif. The CENTURA® semiconductor wafer processing system may be equipped with the plasma etch chamber 302 as described in FIG. 5 or with any other dual frequency capacitive plasma source reactors, which are adapted for processing substrates of various sizes and operated in broad ranges of the process parameters and etchant chemistries. The semiconductor wafer processing system may also be equipped with an endpoint detection system and/or in-situ self-cleaning capabilities. A detailed description of a suitable dual frequency capacitive plasma source reactor is provided in U.S. patent application Ser. No. 10/192,271, filed Jul. 9, 2002 which is commonly assigned to Applied Materials,Inc., and is herein incorporated by reference in its entirety.

While the foregoing is directed to embodiments of the present invention, other and further embodiments of the invention may be devised without departing from the basic scope thereof, and the scope thereof is determined by the claims that follow.

The invention claimed is:

1. A method of forming a dual damascene structure on the surface of a substrate having areas of high feature density and areas of low feature density, comprising:
   depositing a dopant material layer into a dielectric film stack deposited on the surface of the substrate;
   depositing a top layer over the dielectric film stack;
   performing via lithography and via etch into the dielectric film stack;
   performing trench lithography on the top layer to form a trench pattern; and
   performing a trench etch process, wherein trenches are etched slower in areas of high feature density than in areas of low feature density until the dopant material layer is reached, after which trenches are etched faster in areas of high feature density than in areas of low feature density.

2. The method of claim 1, wherein the dopant material layer comprises a trace element.

3. The method of claim 1, wherein the dopant material layer comprises a thin film.

4. The method of claim 1, wherein the dielectric film stack further comprises a polish stop layer.

5. The method of claim 1, wherein the dielectric film stack further comprises an organic fill material layer.

6. The method of claim 1, wherein the dielectric film stack comprises a dielectric bulk insulating layer disposed over a dielectric bottom barrier layer.

7. The method of claim 1, wherein the dopant material layer is deposited at a location predetermined according to a test trench etch profile.

8. The method of claim 1, wherein the trench etch process comprises:
   using a first trench etch chemistry where trenches are etched faster in areas of small critical dimension than in areas of large critical dimension until the dopant material layer is reached; and
   using a second trench etch chemistry where trenches are etched slower in areas of small critical dimension than in areas of large critical dimension to obtain the same trench etch depth in the areas of high feature density and the areas of low feature density.

9. The method of claim 8, wherein the dopant material layer comprises a trace element.

10. The method of claim 8, wherein the dopant material layer comprises a thin film.

11. The method of claim 8, wherein the dielectric film stack further comprises a polish stop layer.

12. The method of claim 8, wherein the dielectric film stack further comprises an organic fill material layer.

13. The method of claim 8, wherein the dielectric film stack comprises a dielectric bulk insulating layer disposed over a dielectric bottom barrier layer.

14. The method of claim 8, wherein the dopant material layer is deposited at a location predetermined according to a test trench etch profile.

15. The method of claim 1, wherein the dielectric stack comprises an organic fill material layer, and the trench etch process comprises:
   using a first etch chemistry adapted to etch the organic fill material layer where trenches are etched slower in areas of small critical dimension than in areas of large critical dimension and residual organic fill materials from a portion of the organic fill material layer are left in areas of small critical dimension; and
   using a second etch chemistry adapted to etch the dielectric film stack where trenches are etched faster in areas of small critical dimension than in areas of large critical dimension.

16. The method of claim 15, wherein the dielectric film stack further comprises a polish stop layer.

17. The method of claim 15, wherein the dielectric film stack further comprises a dielectric bulk insulating layer disposed over a dielectric bottom barrier layer.

18. The method of claim 15, wherein the dielectric film stack further comprises a first dielectric bulk insulating layer and a second dielectric bulk insulating layer.

19. The method of claim 18, wherein the first dielectric bulk insulating layer has a dielectric constant different from the dielectric constant of the second dielectric bulk insulating layer.

20. The method of claim 15, wherein the dielectric film stack is deposited over a bottom barrier layer on the surface of the substrate, and the vias are formed by depositing a polish stop layer over the dielectric film stack and performing via lithography and via etch into the polish stop layer and the dielectric film stack.

* * * * *